United States Patent
Horie et al.

(10) Patent No.: US 6,870,403 B2
(45) Date of Patent: Mar. 22, 2005

(54) COMPARING CIRCUIT, COMPARATOR, LEVEL DETERMINING CIRCUIT AND THRESHOLD VOLTAGE SETTING METHOD

(75) Inventors: Masakiyo Horie, Kamagoori (JP); Takashi Sakurai, Nagoya (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 10/277,981

(22) Filed: Oct. 23, 2002

(65) Prior Publication Data

US 2003/0080784 A1 May 1, 2003

(30) Foreign Application Priority Data

Oct. 30, 2001 (JP) ........................................ 2001-332672

(51) Int. Cl.[7] ............................................... H03K 5/22
(52) U.S. Cl. .............................. 327/63; 327/72; 327/74
(58) Field of Search .............................. 327/50, 51, 52, 327/55, 60, 63, 65, 72, 74, 76, 77, 85, 88

(56) References Cited

U.S. PATENT DOCUMENTS

| | | | | |
|---|---|---|---|---|
| 4,345,169 A | * | 8/1982 | Saleh .......................... | 327/72 |
| 5,563,597 A | * | 10/1996 | McCartney .................. | 341/150 |
| 6,191,989 B1 | * | 2/2001 | Luk et al. .................... | 365/207 |
| 6,346,834 B1 | * | 2/2002 | Chai ............................ | 327/143 |

FOREIGN PATENT DOCUMENTS

| | | |
|---|---|---|
| JP | 53-110784 | 9/1978 |
| JP | 58-1893 | 1/1983 |
| JP | 60-219560 | 11/1985 |
| JP | 2-20121 | 1/1990 |
| JP | 5-235757 | 9/1993 |

* cited by examiner

Primary Examiner—Tuan T. Lam
Assistant Examiner—Hiep Nguyen
(74) Attorney, Agent, or Firm—Posz & Bethards, PLC

(57) ABSTRACT

In a comparing circuit, an input signal switching circuit has a first input terminal, a second input terminal, a first output terminal and a second output terminal. The input signal switching circuit is configured to receive a first input signal inputted to the first input terminal and a second input signal inputted to the second input terminal. The input signal switching circuit is also configured to output the first input signal to switchably one of the first and second output terminals and the second input signal to other thereof in accordance with a switching signal. A comparator has a reverse input terminal and a non-reverse input terminal and configured to receive through the reverse input terminal a first signal outputted from the first output terminal, and receive through the non-reverse input terminal a second signal outputted from the second output terminal.

6 Claims, 7 Drawing Sheets

COMPARING CIRCUIT, COMPARATOR, LEVEL DETERMINING CIRCUIT AND THRESHOLD VOLTAGE SETTING METHOD

BACKGROUND OF THE INVENTION

1. Field of the Invention

The present invention relates to a comparing circuit, a comparator, a level determining circuit and a threshold voltage setting method of the level determining circuit, which are preferable for determining levels of micro input signals.

2. Description of the Related Art

In-vehicle radio systems represented by an ETC (Electric Toll Collection System) and so on are designed to have low consumption current for extending their battery lifetimes. The in-vehicle radio system is, as a means for providing the design, operative to wait-state (sleep-state) its units which need not operate during, for example, a stationary operation period, and to operate its wakeup circuit to output wakeup signals to the Units when the wakeup circuit determines that the predetermined wakeup condition is fulfilled.

An in-vehicle ETC unit, as an example of the in-vehicle radio systems, is operative to receive radio signals sent from an on-road antenna and output an wakeup signal, when the received signal exceeds the predetermined threshold value, to a micro-computer which keeps its sleep-state so as to wakeup the micro-computer.

FIG. 7 shows an electrical configuration of the wakeup circuit used for conventional in-vehicle ETC units. The wakeup circuit 1 which operates at a single polarity power source is provided with an input terminal 2 and an output terminal 3. To the input terminal 2, a voltage Vin of a demodulation signal Sdm passing through a detector is inputted and an wakeup signal Swk is outputted from the output terminal 3. The wakeup signal Sdk turns into a H (High) level when the demodulation voltage Vin exceeds the threshold voltage Vth. The wakeup circuit 1 also has a reference voltage generating circuit 4 which is provided with a D/A (digital to analog) converter. The reference voltage generating circuit 4 is operative to output a reference voltage Vref that it can gradually set from 0 V by a predetermined voltage according to a decode signal of n bits. The wakeup circuit 1 is provided with a comparator 5 having a reverse terminal common to the input terminal 2 and a non-reverse input terminal. The comparator 5 compares the demodulation voltage Vin inputted to the reverse input terminal 2 and the reference voltage Vref inputted to the non-reverse input terminal, outputting a reference signal on the basis of the compared result. The outputted signal from the comparator 5 is inputted to an inverter 6 of the wakeup circuit 1 so as to turn into the wakeup signal Swk.

In this configuration, the comparator 5 has an offset voltage caused by characteristic differences of its elements which occur in the manufacture thereof so that the offset voltage causes the threshold voltage Vth of the wakeup circuit 1 and the reference voltage Vref to be not necessarily in agreement with each other. An adjustment of each threshold voltage Vth of each in-vehicle ETC unit is therefore required. The adjustment of threshold voltage is performed as follows.

That is, the decode signals are sequentially switched while the radio signal having threshold power which permits an object unit to be woken up is provided, and the lowest reference voltage in the range within which the wakeup signal Swk has an L (low) level is set as the threshold voltage.

The adjustment, however, causes a problem in cases where the comparator 5 has a negative offset voltage, that is, the output of the comparator 5 does not become a low level unless the voltage of the reverse input terminal exceeds that of the non-reverse input terminal by only the absolute value of offset voltage. Namely, in cases where the absolute value of offset voltage Voffset is higher than the threshold voltage Vth, even if the reference voltage Vref is set to 0 V which is the lowest voltage in the range, the wakeup signal Swk does not turn into the H level unless the moderation voltage Vin is not less than the absolute value of offset voltage Voffset. As a result, it is difficult to adjust the threshold voltage Vth so that the threshold value Vth is not more than the absolute value of offset voltage Voffset, causing the receiving sensitivity with respect to the input signal to the comparator 5 for the wakeup of the object unit to be lowered.

For solving the problem, an negative reference voltage Vref may be generated, or a comparator 5 having a lower offset voltage may be adopted. However, the former measure requires a new negative power source and the former and latter measures complicate the circuit configuration of the wakeup circuit, causing the design and manufacture costs thereof to be increased. The complicated circuit configuration of the wakeup circuit causes the consumption current to be increased so that the result is contrary to the original design concept of the in-vehicle radio systems having low consumption current.

SUMMARY OF THE INVENTION

The present invention is made on the background of the foregoing circumstances. Accordingly, it is an object of the present invention to provide a comparing circuit, a comparator, a level determining circuit and a threshold voltage setting method of the level determining circuit, each of which is capable of setting a desired threshold level with respect to a micro input signal inputted to each circuit while preventing each circuit configuration from being complicated and the consumption current of each circuit from being increased.

In order to achieve such object, according to one aspect of the present invention, there is provided a comparing circuit comprising: an input signal switching circuit having a first input terminal, a second input terminal, a first output terminal and a second output terminal, and configured to receive a first input signal inputted to the first input terminal and a second input signal inputted to the second input terminal, the input signal switching circuit being configured to output the first input signal to switchably one of the first and second output terminals and the second input signal to other thereof in accordance with a switching signal; and a comparator having a reverse input terminal and a non-reverse input terminal and configured to receive through the reverse input terminal a first signal outputted from the first output terminal, and receive through the non-reverse input terminal a second signal outputted from the second output terminal.

In preferred embodiment of this one aspect, the comparator compares the first input signal and the second input signal so as to output a result signal representing a result of the comparison, and further comprising: an output logic switching circuit configured to receive the result signal so as to switchably execute, in accordance with the switching signal, one of a reversing process that reverses the result signal to output the reversed result signal and a non-reversing process that keeps a state of the result signal to output the result signal.

According to the one aspect of the present invention, the first input signal is outputted to one of the first and second output terminals and the second input signal is outputted to other thereof in accordance with the switching signal so that the first signal outputted from the first output terminal is received through the reverse input terminal to the comparator, and the second signal outputted from the second output terminal is received through the non-reverse input terminal to the comparator. Therefore, the result signal is reversed or non-reversed from the comparator in accordance with the switching signal. That is, the switching operation of the first and second input signals with respect to the comparator and the reversing operation of the result signal outputted from the comparator are executed to correspond to each other so that the operations of the comparing circuit are kept unchanged except for the polarity of offset voltage regardless of the switching signal.

Usually, a comparator has the offset voltage caused by characteristic differences of its elements which occur in the manufacture thereof so that the polarities and magnitudes of the offset voltages are different every comparators, causing that it is difficult to set the threshold voltage which is lower than the offset voltage.

With respect to the problem, according to the one aspect of the present invention, reversing the switching signal allows the polarities of the first input signal and the second input signal inputted to the comparator to be reversed, making it possible to reverse the polarity of the offset voltage caused by the differences between the first and second input signals. Therefore, even if a circuit for which the comparator is applied has single polarity battery, it is possible to set any desired threshold voltage regardless of the polarity of the offset voltage of the comparator, allowing the comparing circuit which is preferable for dealing with micro input signals. In addition, the input signal switching circuit and the output logic switching circuit have compact circuit sizes, respectively, so that it is possible to simplify the circuit structure of the comparing circuit as compared with that of the conventional comparing circuit, and it is possible to keep the total consumption current in the comparing circuit substantially similar to that in the conventional comparing circuit.

In preferred embodiment of this one aspect, the input signal switching circuit comprises: a first analog switching circuit connected between the first input terminal and the first output terminal; a second analog switching circuit connected between the first input terminal and the second output terminal; a third analog switching circuit connected between the second input terminal and the first output terminal; and a fourth analog switching circuit connected between the second input terminal and the second output terminal, and is configured to turn on only the first and fourth analog switching circuits when the switching signal has a first logic level, and to turn on only the second and third analog switching circuits when the polarity switching signal has a second logic level, the second logic level is a reverse of the first logic level.

According to the preferred embodiment of this one aspect, when only the first and fourth analog switching circuits are turned on, the first input signal and the second input signal are inputted to the reverse input terminal and the non-reverse input terminal, respectively, and when only the second and third analog switching circuits are turned on, the first input signal and the second input signal are reversed to be inputted to the non-reverse input terminal and the reverse input terminal, respectively. Because the comparator has strongly high impedance so that it is possible to substantially prevent an error of the voltage due to providing the analog switching circuits.

One aspect of the present invention has an arrangement that the output logic switching circuit is configured to execute an exclusive-or process on the basis of the switching signal and the result signal so as to output a logic signal generated by the exclusive-or process, the switching signal representing one of a first logic level and a second logic level, and the result signal representing one of the first logic level and the second logic level, the second logic level being a reverse of the first logic level.

According to the arrangement of the one aspect of the present invention, the logical switching operations of the result signal are executed on the basis of the exclusive-or process so that it is possible to make compact the circuit structure of the output logic switching circuit.

In order to achieve such object, according to another aspect of the present invention, there is provided a comparator comprising: a first input terminal; a second input terminal; an output terminal; a differential amplifier including a first differential input transistor, a second differential input transistor connected thereto and a load circuit connected to the first differential input transistor and the second differential input transistor; an amplifier connected between the differential amplifier and the output terminal; and an input signal switching circuit connected to the first input terminal and the second input terminal and configured to supply, in accordance with a switching signal, a first signal to switchably one of the first differential input transistor and the second differential input transistor, the first signal being inputted to the first input terminal, the input signal switching circuit being configured to supply, in accordance with the switching signal, a second signal to switchably other of the first differential input transistor and the second differential input transistor, the second signal being inputted to the second input terminal.

Preferred embodiment of the another aspect, further comprises: an output signal switching circuit configured to receive a first output signal outputted from the first differential input transistor and a second output signal outputted from the second differential input transistor, and to provide switchably one of the first and second output signals to the amplifier.

According to the another aspect of the present invention, the first signal inputted to the first input terminal and the second signal inputted to the second input terminal are inputted to the first differential input transistor and the second input transistor, respectively, or the second differential input transistor and the first differential input transistor, respectively. In response to the above operation, one of the first and second output signals from the first and second differential input transistors is selected to be provided to the amplifier.

This means that the connection relationships between the first and second input terminals and the first and second differential input transistors of the differential amplifier are switched. That is, the connection relationships are switched as if only the differential amplifier is once taken out from the comparator, and the first and second differential input transistors with the load circuit of the differential amplifier are switched, after the switching operation, the differential amplifier is returned to the comparator. Therefore, the circuit configuration itself of the comparator is kept unchanged regardless of the switching signal, and the operations of the comparator are unchanged except for the occurrence of the offset voltage.

The offset voltage is caused by characteristic differences of the first and second differential input transistors so that reversing the switching signal and the connection relationships between the differential input transistors and the first and second signals allow the polarity of the offset voltage to be reversed. It is possible to obtain the same effect with respect to the setting of the threshold voltage of the comparing circuit according to the one aspect. In addition, the input signal switching circuit and the output signal switching circuit have compact circuit sizes, respectively, so that it is possible to simplify the circuit structure of the comparator as compared with that of the conventional comparator, and it is possible to keep the total consumption current in the comparator substantially similar to that in the conventional comparator.

In preferred embodiment of this another aspect, the input signal switching circuit comprises: a first analog switching circuit connected between the first input terminal and the first differential input transistor; a second analog switching circuit connected between the first input terminal and the second differential input transistor; a third analog switching circuit connected between the second input terminal and the first differential input transistor; and a fourth analog switching circuit connected between the second input terminal and the second differential input transistor, and is configured to turn on only the first and fourth analog switching circuits when the switching signal has a first logic level, and to turn on only the second and third analog switching circuits when the switching signal has a second logic level, the second logic level being a reverse of the first logic level.

According to the preferred embodiment of this another aspect, when only the first and fourth analog switching circuits are turned on, the first signal and the second signal are inputted to the first differential input transistor and the second differential input transistor, respectively, and when only the second and third analog switching circuits are turned on, the first signal and the second signal are reversed to be inputted to the second differential input transistor and the first differential input transistor, respectively. Because each differential input transistor has strongly high impedance so that it is possible to substantially prevent an error of the voltage due to providing the analog switching circuits.

In preferred embodiment of this another aspect, the load circuit is a current mirror circuit including a first load transistor connected to the first differential input transistor, and a second load transistor connected to the second differential input transistor, and the output signal switching circuit is configured to connect, in accordance with the switching signal, a middle section and a section of one of the first load transistor and the second load transistor.

According to the preferred embodiment of this another aspect, the input terminals and the differential input transistors are switched according to the switching signal, and, in response to the switching operation, the middle section and the section of one of the first load transistor and the second load transistor is switchably connected in accordance with the switching signal. In this case, the connection relationships between the first and second differential input transistors and the first and second load transistors are kept unchanged so that the polarity of the offset voltage is only changed but the magnitude thereof is kept unchanged in accordance with the switching signal.

In preferred embodiment of this another aspect, the output signal switching circuit comprises: a fifth analog switching circuit connected between a first output terminal of the first differential input transistor and an input terminal of the amplifier; a sixth analog switching circuit connected between a second output terminal of the second differential input transistor and the input terminal of the amplifier; a seventh analog switching circuit connected between the middle section and the section of the first load transistor; and an eighth analog switching circuit connected between the middle section and the section of the second load transistor, and the output signal switching circuit is configured to turn on only the fifth and eighth analog switching circuits when the switching signal has a first logic level, and to turn on only the sixth and seventh analog switching circuits when the switching signal has a second logic level, the second logic level being a reverse of the first logic level.

According to the another aspect of the present invention, when the fifth and eighth analog switching circuits are only turned on in accordance with the switching signal, the output signal is taken out from the second differential input transistor, and when the sixth and seventh analog switching circuits are only turned on in accordance with the switching signal, the output signal is taken out from the first differential input transistor.

In order to achieve such object, according to further aspect of the present invention, there is provided a level determining circuit for determining a level of an input signal thereto comprising: a comparing circuit according to claim 1; a reference voltage generating circuit capable of generating a plurality of reference voltages and configured to output one of the reference voltages, the outputted reference voltage corresponding to a reference voltage setting signal inputted to the reference voltage generating circuit; and a threshold voltage setting circuit configured to output a predetermined switching signal to the comparing circuit and to output the reference voltage setting signal to the reference voltage generating circuit, wherein the input signal is inputted to the first input terminal of the comparing circuit as the first input signal, and the reference voltage is inputted to the second input terminal thereof as the second input signal.

According to the further aspect of the present invention, the input signal is inputted to the first input terminal of the comparing circuit according to claim 1, and the reference voltage is inputted to the second input terminal of the comparing circuit from the reference voltage generating circuit. The level determining circuit according to the further aspect can set the polarity of the offset voltage of the comparing circuit with respect to the first and second input signals in accordance with the switching signal so that setting the switching signal and adjusting the reference voltage within the single battery voltage such as positive voltage or negative voltage allow micro threshold voltage to be set.

In order to achieve such object, according to still further aspect of the present invention, there is provided a level determining circuit for determining a level of an input signal thereto comprising: a comparator according to claim 5; a reference voltage generating circuit capable of generating a plurality of reference voltages and configured to output one of the reference voltages, the outputted reference voltage corresponding to a reference voltage setting signal inputted to the reference voltage generating circuit; and a threshold voltage setting circuit configured to output a predetermined switching signal to the comparator and to output the reference voltage setting signal to the reference voltage generating circuit, wherein the reference voltage is inputted to the first input terminal of the comparator as the first signal, and the input signal is inputted to the second input terminal thereof as the second signal.

According to the still further aspect of the present invention, the level determining circuit executes substantially same operations of the level determining circuit according to the further aspect.

In order to achieve such object, according to still further aspect of the present invention, there is provided a method of setting a threshold voltage of the level determining circuit according to claim 10, the method comprising the steps of: setting the reference voltage setting signal so as to allow a lowest reference voltage in the plurality of reference voltages to be set from the reference voltage generating circuit, setting the switching signal to have a first logic level and inputting to the first input terminal of the comparing circuit a threshold voltage of the input signal; changing sequentially a value of the reference voltage setting signal to increase sequentially the reference voltages corresponding to the changed values of the reference voltage setting signal in a case where the comparing circuit outputs a first determining result representing that the threshold voltage is higher than the reference voltage so as to stop the change of the value of the reference voltage setting signal when the comparing circuit outputs a second determining result representing that the threshold voltage is not higher than the reference voltage; storing the first logic level of the first signal and the values of reference voltage setting signal at the time that the change operation is stopped, the first logic level and values of reference voltage setting signal which are stored corresponding to the threshold voltage; reversing the first logic level of the switching signal into a second logic level thereof which is a reverse of the first logic level in a case where the comparing circuit outputs the second determining result and changing sequentially the value of the reference voltage setting signal so as to increase sequentially the reference voltages corresponding to the changed values of the reference voltage setting signal, thereby stopping the change of the value of the reference voltage setting signal when the comparing circuit further outputs the second determining result; and storing the second logic level of the first signal and the values of reference voltage setting signal at the time that the change is stopped, the second logic level and values of reference voltage setting signal which are stored corresponding to the threshold voltage.

In order to achieve such object, according to still further aspect of the present invention, there is provided a method of setting a threshold voltage of the level determining circuit according to claim 12, the method comprising the steps of: setting the reference voltage setting signal so as to allow a lowest reference voltage in the plurality of reference voltages to be set from the reference voltage generating circuit so as to set the switching signal to have a first logic level, thereby inputting to the first input terminal of the comparator a threshold voltage of the input signal; changing sequentially a value of the reference voltage setting signal to increase sequentially the reference voltages corresponding to the changed values of the reference voltage setting signal in a case where the comparator outputs a first determining result representing that the threshold voltage is higher than the reference voltage so as to stop the change of the value of the reference voltage setting signal when the comparator outputs a second determining result representing that the threshold voltage is not higher than the reference voltage; storing thereon the first logic level of the first signal and the values of reference voltage setting signal at the time that the change operation is stopped, the first logic level and values of reference voltage setting signal which are stored corresponding to the threshold voltage; reversing the first logic level of the switching signal into a second logic level thereof which is a reverse of the first logic level in a case where the comparator outputs the second determining result and changing sequentially the value of the reference voltage setting signal so as to increase sequentially the reference voltages corresponding to the changed values of the reference voltage setting signal, thereby stopping the change of the value of the reference voltage setting signal when the comparator further outputs the second determining result; and storing thereon the second logic level of the first signal and the values of reference voltage setting signal at the time that the change is stopped, the second logic level and values of reference voltage setting signal which are stored corresponding to the threshold voltage.

According to the still further aspects of the present invention, the lowest reference voltage is set in accordance with the reference voltage switching signal, and the switching signal is set as the first logic level. The threshold voltage of the input signal is inputted to the first input terminal of the comparing circuit (comparator).

In a case where the comparing circuit (comparator) outputs the first determining result representing that the threshold voltage is higher than the reference voltage, the value of the reference voltage setting signal is changed sequentially so that the reference voltages corresponding to the changed values of the reference voltage setting signal are increased sequentially and the change of the value of the reference voltage setting signal is stopped when the comparing circuit (comparator) outputs the second determining result representing that the threshold voltage is not higher than the reference voltage. The first logic level of the first signal and the values of reference voltage setting signal at the time that the change operation is stopped are stored such that the first logic level and values of reference voltage setting signal correspond to the threshold voltage.

In a case where the comparing circuit (comparator) outputs the second determining result, the first logic level of the switching signal is reversed into the second logic level thereof which is the reverse of the first logic level and the value of the reference voltage setting signal is sequentially changed so that the reference voltages corresponding to the changed values of the reference voltage setting signal is sequentially increased. The change of the value of the reference voltage setting signal is stopped when the comparing circuit (comparator) further outputs the second determining result. The second logic level of the first signal and the values of reference voltage setting signal at the time that the change is stopped are stored. The second logic level and values of reference voltage setting signal correspond to the threshold voltage.

Therefore, it is possible to set the threshold voltage by using the stored first logic level and values of the reference voltage setting signals or the stored second logic level and values of reference voltage setting signal.

BRIEF DESCRIPTION OF THE DRAWINGS

Other objects and aspects of the present invention will become apparent from the following description of embodiments with reference to the accompanying drawings in which.

DETAILED DESCRIPTION OF THE PREFERRED EMBODIMENTS

First Embodiment

A first embodiment of the present invention in which the present invention is applied to an in-vehicle ETC unit will be described hereinafter with reference to FIG. 1 to FIG. 3.

An ETC is a system in which time-division two-way communications are performed between an ETC transceiver installed in a tollgate and the in-vehicle ETC unit installed in a vehicle so that a predetermined toll is automatically collected from an user in the vehicle without the vehicle being stopped. The two-way communications use radio waves of 5.8 GHz band which are amplitude modulated.

Figure 1:
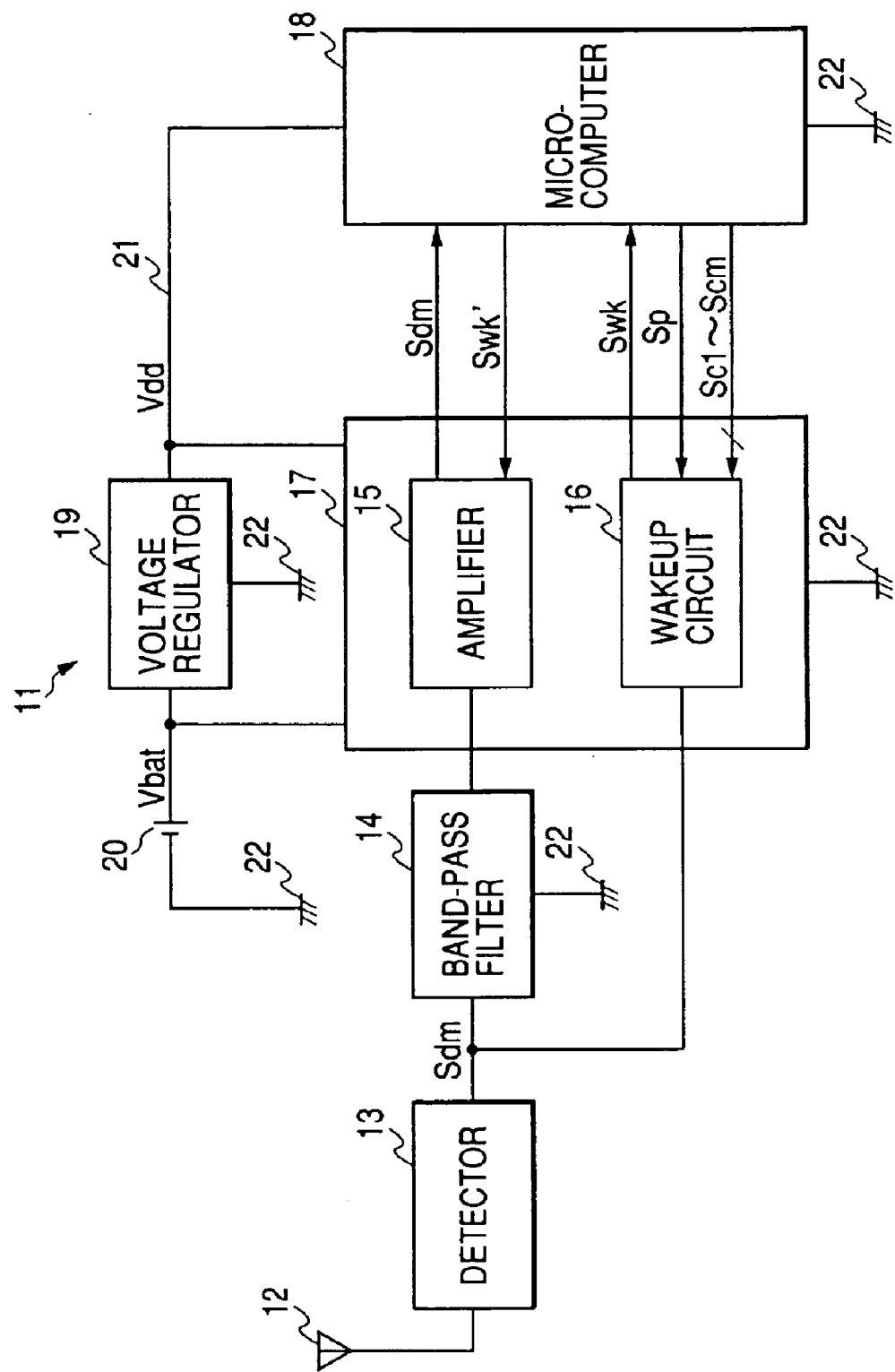
FIG. 1 is a block diagram showing mainly a part of an electrical configuration of an in-vehicle ETC unit according to a first embodiment of the present invention.

FIG. 1 is a block diagram showing mainly a part of an electrical configuration of the in-vehicle ETC unit, which is mainly related to a receiving operation so that a transmitting circuit, a display unit, an operation unit and a card-reader/writer are omitted in FIG. 1.

In FIG. 1, the in-vehicle ETC unit 11 comprises an antenna 12 for receiving a radio signal transmitted from a road antenna and a detector 13 for performing an envelope detection with respect to the received signal so as to output a modulation signal Sdm which is frequency modulated at 250 kHz/500 kHz. The ETC unit 11 also comprises a band-pass filter 14, an IC 17 including an amplifier 15 and an wakeup circuit 16, a single-chip microcomputer 18, a voltage regulator 19 and a battery 20. A battery voltage Vbat of the battery 20 is, for example, 3V, and the voltage regulator supplies a battery voltage Vdd of, for example, 2.5 V to the IC 17 and the microcomputer 18 through the battery lines 21, 22.

The amplifier 15 is operative to amplify the modulation signal Sdm to convert the modulated signal into a digital signal, thereby outputting the digital signal to the microcomputer 18. The wakeup circuit 16, which is described in detail hereinafter, is operative to output an wakeup signal Swk to the microcomputer 18 in cases where the voltage Vin of the modulation signal Sdm (referred to as "modulation voltage Vin" hereinafter) turns into no less than a predetermined threshold voltage Vth.

Figure 2:
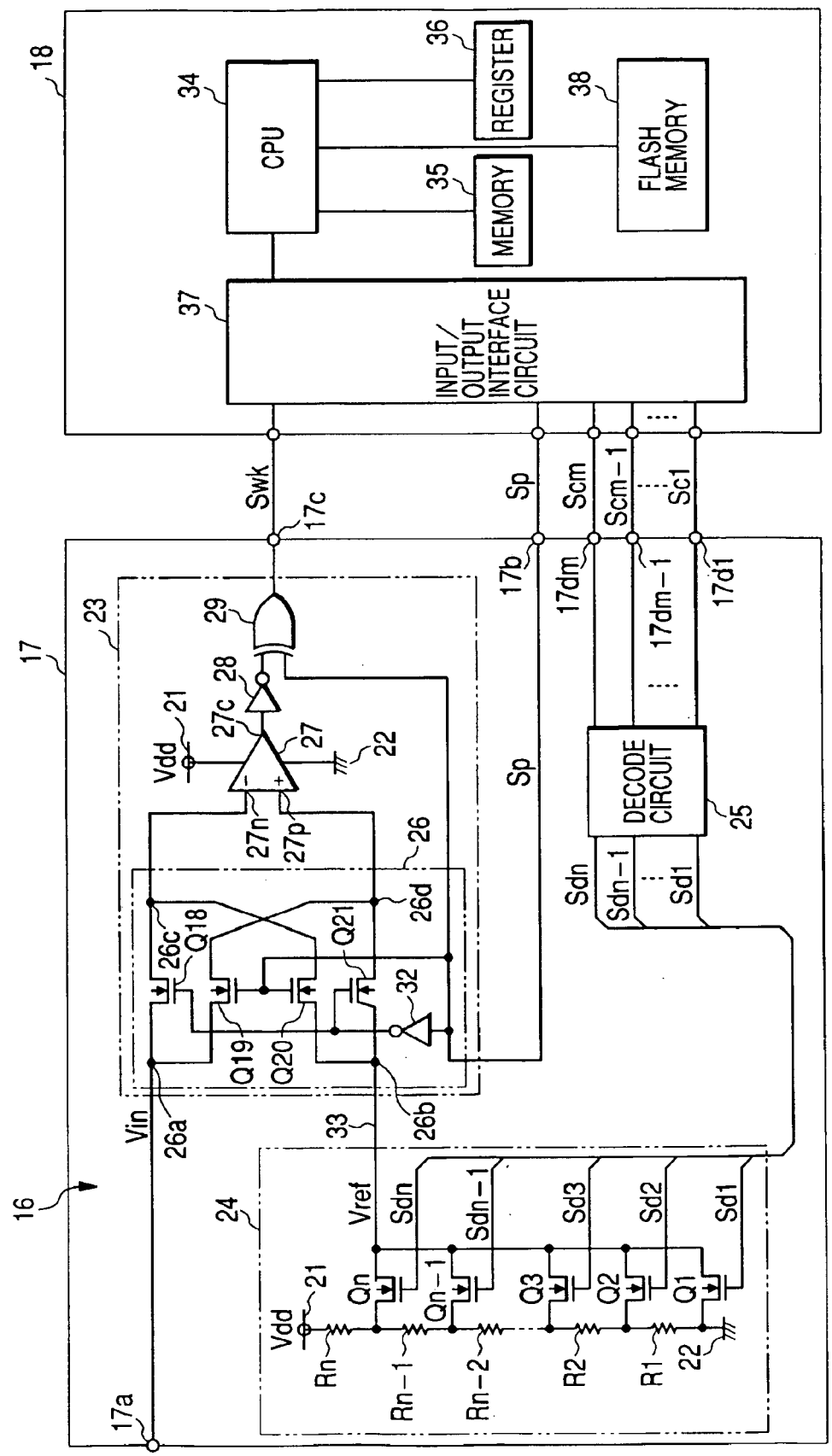
FIG. 2 is a view showing an electrical configuration of a level determining circuit in the in-vehicle ETC unit according to the first embodiment of the present invention.

FIG. 2 shows an electrical configuration of a level determining circuit in the in-vehicle ECT unit 11 according to the first embodiment of the present invention. The level determining circuit is composed of the wakeup circuit 16 in the IC 17 and the microcomputer 18 corresponding to "threshold voltage setting circuit". The wakeup circuit 16 comprises a comparing circuit 23, a D/A (digital to analog) converter 24 corresponding to a reference voltage generating circuit and a decode circuit 25. The comparing circuit 23 comprises a switching circuit 26 corresponding to an input switching circuit, a comparator 27, an inverter 28 and an exclusive-or executing circuit 29 corresponding to an output logic switching circuit. The exclusive-or executing circuit 29 is referred to as "EX-OR circuit 29 hereinafter.

A concrete configuration of each circuit in the level determining circuit is explained hereinafter.

Figure 3:
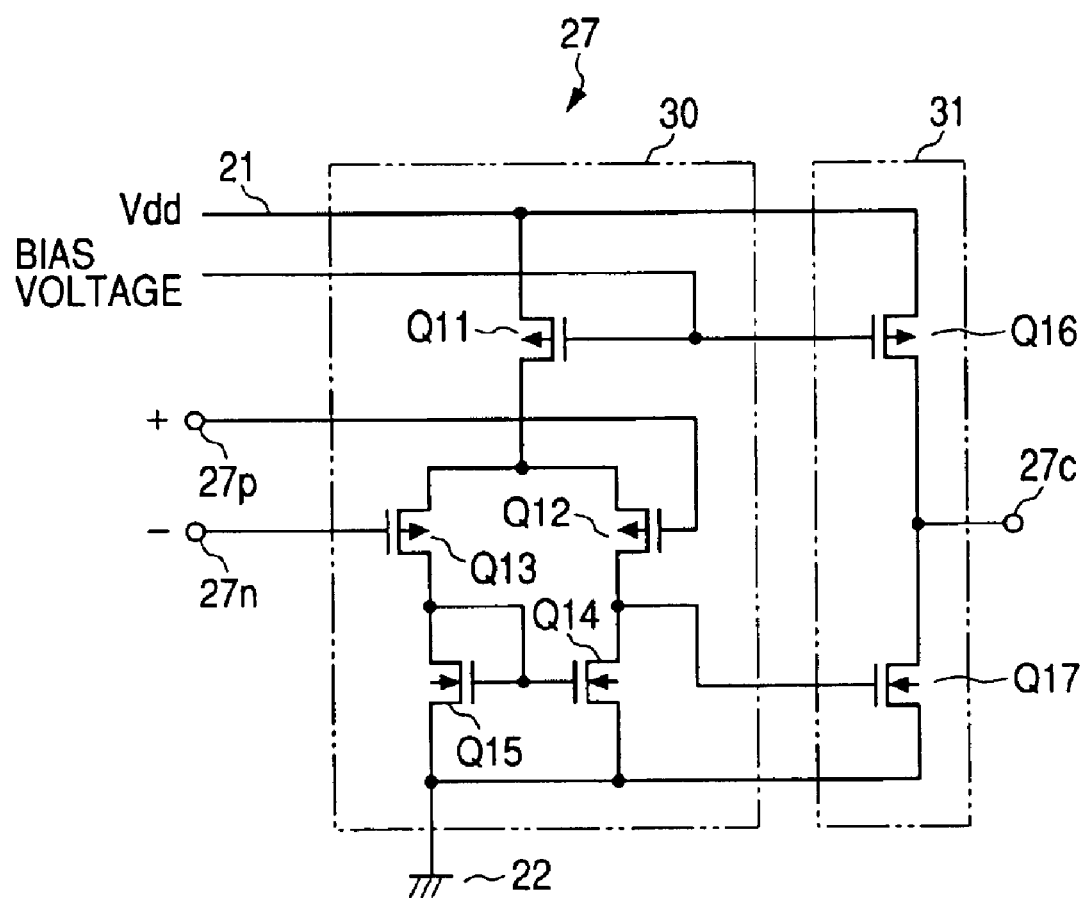
FIG. 3 is a view showing a circuit configuration of a comparator in the level determining circuit according to the first embodiment of the present invention.

The comparator 27 has a general circuit configuration shown in FIG. 3. The comparator 27 is provided with a differential amplifier 30 comprising MOS transistors Q11 to Q 15 located between the battery lines 21, 22 and an amplifier 31 comprising MOS transistors Q 16 and Q 17 located between the battery lines 21, 22. The MOS transistors Q12 and Q 13 are connected to a non-reverse input terminal 27p and a reverse input terminal 27n of the comparator 27, respectively, so that the MOS transistors Q14 and Q15 of which a current mirror circuit is composed provide an active load (load circuit) of the MOS transistors Q12 and Q13. Each of the MOS transistors Q16 and Q17 has three sections (terminals) that are attached to electrode regions within each of the MOS transistors Q16 and Q17. The middle section of each MOS transistor is known as a gate, and the other two sections as a drain and a source. The drains of the MOS transistors Q16 and Q17 are connected commonly to each other, and the drain of each of the transistors Q16 and Q17 is connected to an output terminal 27c. Similarly, each of the MOS transistors Q11 and Q12 has three sections (terminals) that are attached to electrode regions within each of the MOS transistors Q11 and Q12. The middle section of each MOS transistor is known as a gate, and the other two sections as a drain and a source. The gates of the MOS transistors Q11 and Q12 are connected commonly to each other, and each of the gates of each of the MOS transistors Q11 and Q12 is subjected to a bias voltage.

On the other hand, in FIG. 2, the switching circuit 26 is provided with n-channel MOS transistors Q 18 to Q21, and an inverter 32.

The MOS transistor Q18 is connected between a terminal 17a and the reverse input terminal 27n, and the MOS transistor Q19 is connected between the terminal 17a and the non-reverse input terminal 27p. The MOS transistor Q20 is connected between an output line of the D/A converter 24 and the reverse input terminal 27n, and the MOS transistor Q21 is located between the output line of the D/A converter 33 and the non-reverse input terminal 27p so as to be connected thereto.

The microcomputer can supply a polarity switching signal Sp corresponding to a switching signal through a terminal 17b to the gates of the MOS transistors Q19 and Q20, and the polarity switching signal Sp is reversed by the inverter 32 so that the reversed polarity switching signal Sp' is configured to be supplied to the gates of the MOS transistors Q18 and Q21.

That is, when the polarity switching signal Sp has a high (H) level which corresponds to a first logic level and is higher than a low (L) level corresponding to a second logic level that is a reverse of the H level (first logic level, the MOS transistors Q19 and Q20 to which the signals Sp are inputted turn on, respectively, but the MOS transistors Q18 and Q21 keep their off-states, respectively, because, to the MOS transistors Q18 and Q21, the reversed polarity switching signals Sp' each of which is reversed from the H level to the L level are inputted.

On the contrary, when the polarity switching signal Sp has the L level, the MOS transistors Q18 and Q21 to which the reversed signals Sp' are inputted turn on, respectively, because, to the MOS transistors Q18 and Q21, the reversed polarity switching signals Sp' each of which is reversed from the L level to the H level are inputted, but the MOS transistors Q19 and Q20 keep off-states, respectively, because, to the MOS transistors Q19 and Q20, the polarity switching signals Sp each having the L level are inputted.

The MOS transistors Q18 to Q21 correspond to a first to fourth analog switching circuits according to the first embodiment of the present invention, respectively, and nodes 26a, 26b, 26c and 26d shown in FIG. 2 correspond to a first input terminal, a second input terminal, a third input terminal and a fourth input terminal of the present invention, respectively.

The comparator 27 has an output terminal 27c connected through the inverter 28 to one of input terminals of the EX-OR circuit 29, and, to other thereof, the polarity switching signal Sp is supplied.

The D/A converter 24 comprises resistors R1, R2, . . . , Rn which are sequentially connected between the battery lines 21 and 22. The D/A converter 24 also comprises MOS transistors Q1, Q2, . . . , Qn which are served as a switching circuit. Each of the MOS transistors Q1, Q2, . . . , Qn is connected between each voltage division point of each MOS transistor and the output line 33.

The IC 17 has terminals 17d1 to 17dm to which m binary switching signals Sc1 to Scm for selectively switching any one of the MOS transistors Q1, Q2, . . . , Qn are inputted.

The decode circuit 25 is configured to decode these switching signals Sc1 to Scm so as to generate n decode signals Sd1 to Sdn, n which equals to $2^m$, and to provide these decode signals Sd1 to Sdn to the gates of the MOS transistors Q1 to Qn, respectively.

For example, when the microcomputer 18 outputs the switching signals Sc1 to Scm for turning on only the transistor Q1, the decode circuit 25 makes only the decode signal Sd1 a high (H) level and keeps other decode signals Sd2 to Sdn L (low) level state so as to output the decode signals Sd1 to Sdn to the gates of the MOS transistors Q1 to Qm. The MOS transistor Q1 only turns on so that the D/A converter 24 outputs the reference voltage Vref which is obtained on the basis of the battery voltage Vdd and the resisters RI to Rh.

That is, the D/A converter 24 is operative to gradually output the reference voltage Vref ranging from the minimum value of 0V corresponding to the on-state of the MOS transistor Q1 to the maximum value corresponding to the on-state of the MOS transistor Qn each predetermined voltage according to the decode signals Sd1 to Sdn.

The microcomputer 18 is operative to execute a toll collection process according to the inputted signals from the amplifier 15, and also has a function as the threshold voltage setting circuit with respect to the wakeup circuit 16, described above.

The microcomputer 18 comprises a CPU 34 for executing the toll collection process, the threshold voltage setting process and other processes, a rewritably non-volatile memory 35, for example, an EEPROM, connected to the CPU 34. Data allowing the CPU 34 to execute at least one of these processes are stored on the memory 35. The microcomputer 18 also comprises a register 36 connected to the CPU 34 for temporarily storing thereon data to be processed by the CPU 34, an input/output interface circuit 37 connected to the CPU 34 and having, for example, input/output ports which connect the terminals 17c, 17b, 17d1 to 17dm of the IC 17, respectively, for executing interface processes between the IC 17 and the CPU 34 and so on. Moreover, the microcomputer 18 comprises a flash memory 38 connected to the CPU 34 for storing thereon data including an adjustment program allowing the CPU 34 to execute at least the threshold voltage setting process, a display unit interface (I/F) unit which is connected to the CPU 34 and the display unit, and performs interface processes therebetween, an operation unit interface (I/F) unit which is connected to the CPU 34 and the operation unit, and carries out interface processes therebetween, a card interface (I/F) unit which is connected to the CPU 34 and the card-reader/writer, and executes interface processes therebetween. The display unit I/F unit, the operation unit I/F unit and the card I/F unit are not shown in FIG. 2.

Incidentally, signal lines connected to the microcomputer 18 and the amplifier 15 are omitted in FIG. 2.

Next, operations of the level determining circuit in the in-vehicle ETC unit and a method of setting the threshold voltage of the level determining circuit according to the first embodiment will now be explained hereinafter.

The in-vehicle ETC unit which operates on the basis of the battery 20 as its power source need be designed to have low consumption current for extending a lifetime of the battery 20. The in-vehicle ETC unit need to operate only when the vehicle in which the in-vehicle ETC unit is installed is passed through the tollgate so that the in-vehicle ETC unit watches radio signals transmitted from on-road antennas, and, in cases where the in-vehicle ETC unit does not receive the radio signals therefrom, the in-vehicle ETC unit asserts a wait-state (sleep-state) in the amplifier 15, the microcomputer 18 and so on.

The wakeup circuit 16 continually watches (determines) whether the modulation voltage Vin exceeds the threshold voltage Vth, that is the wakeup condition, and when the wakeup circuit 16 determines that the modulation voltage Vin exceeds the threshold voltage Vth, the wakeup circuit 16 outputs the wakeup signal Swk with the H (High) level (first logic level) to the microcomputer 18. The wakeup signal Swk makes the microcomputer 18 shift from its sleep state to its operation state so that the microcomputer 18 outputs the wakeup signal Swk' to the amplifier 15 and starts to execute the toll collection process.

Now, the modulation voltage Vin inputted to the amplifier 15 is small, and, when, especially, the in-vehicle ECT unit starts to execute the wakeup process, that is, it starts to receive the radio signals, the modulation voltage Vin gets to be a voltage which is approximately similar to the offset voltage of the comparator 27 of which the comparing circuit 23 is composed.

Then, when checking the in-vehicle ETC unit before shipping it, the adjustment of the threshold voltage Vth of the in-vehicle ETC unit is performed, which is described hereinafter in detail, for setting the threshold voltage Vth to the predetermined voltage independently of the magnitude of the offset voltage, and the positive and negative thereof.

First, an adjustment command is transmitted to the microcomputer 18 of the in-vehicle ETC unit from an exterior thereof. The microcomputer 18 receives the transmitted adjustment command to shift its operation mode into an adjustment mode, thereby reading out the adjustment program from the flash memory 38 and executing it. Next, a radio signal having threshold power corresponding to the threshold voltage of the in-vehicle ETC unit is transmitted thereto. The magnitude of the modulation voltage Vin inputted to the wakeup circuit 16 according to the transmitted radio signal corresponds to the threshold voltage Vth.

Figure 4:
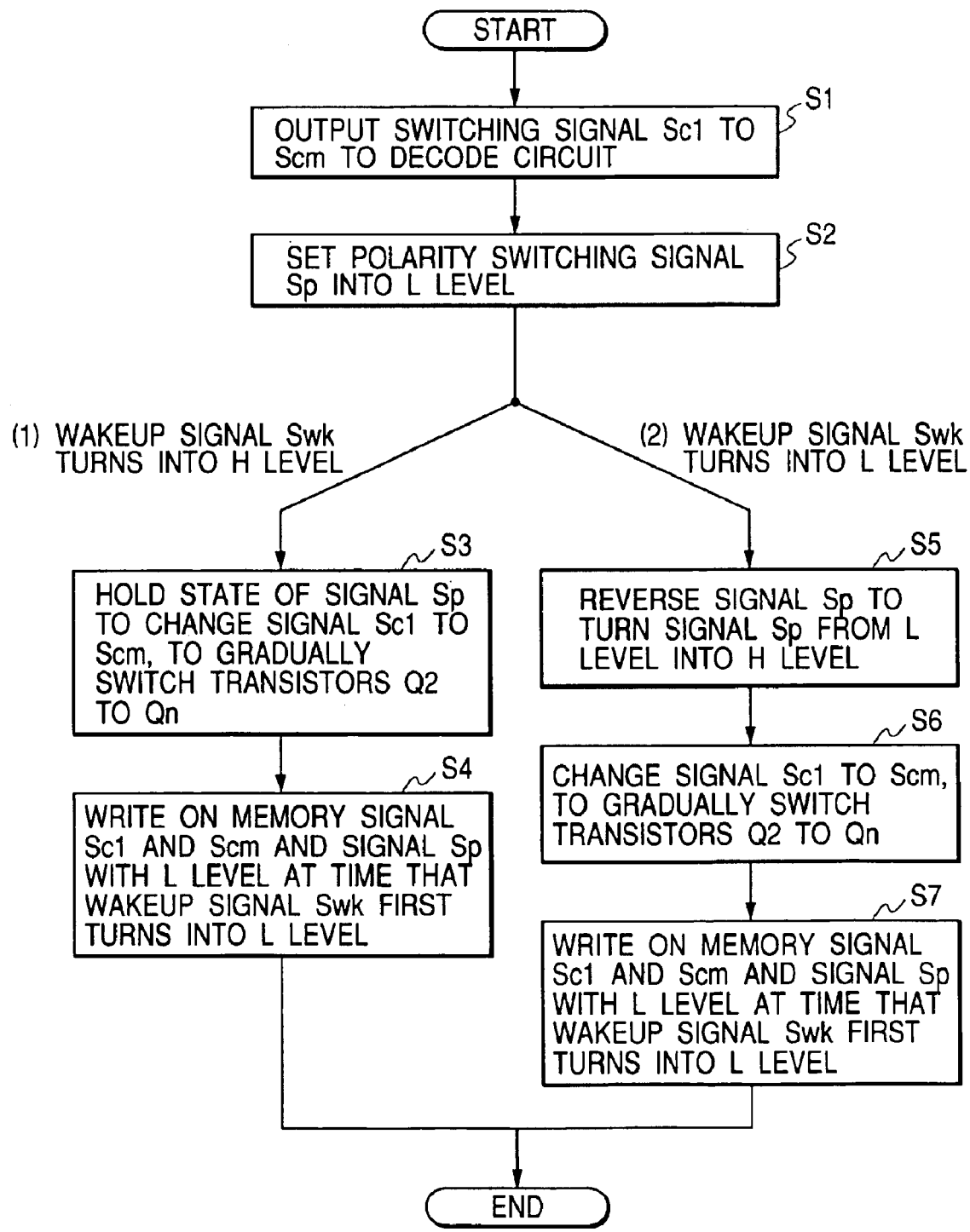
FIG. 4 is flow chart showing threshold voltage setting processes of a microcomputer shown in FIG. 2 according to the first embodiment.

Under the above circumstances of the radio signal, as shown in FIG. 4, the microcomputer 18, on the basis of the adjustment program, outputs to the decode circuit 25 the switching signals Sc1 to Scm (0H) for turning on the transistor Q1 in Step S1. The switching signals Sc1 to Scm cause the decode signal Sd1 to become the H level so that the MOS transistor Q 1 turns on, whereby the D/A converter 24 outputs the reference voltage Vref having the minimum voltage of 0V in the voltages which the D/A converter 24 can output. The microcomputer 18 sets the polarity switching signal Sp into an initial value, such as, the L level in Step S2. The polarity switching signal Sp with the L level is reversed to the signal Sp' with the H level so that the signal Sp' makes the MOS transistors Q18 and Q21 turn on so that the modulation voltage Vin which corresponds to the threshold voltage Vth and the reference voltage Vref which equals to 0 V are inputted to the reverse input terminal 27n and the non-reverse input terminal 27p of the comparator 27, respectively.

When the modulation voltage Vin and the reference voltage Vref are inputted to the comparator 27, the wakeup signal Swk outputted from the EX-OR circuit 29 does not necessarily have the H level depending on the offset voltage of the comparator 27.

(1) In cases where the wakeup signal Swk turns into the H level, that is, the EX-OR circuit 29 executes an exclusive-or process on the basis of the polarity switching signal Sp inputted to the other input terminal of the EX-OR circuit 29 and the output signal inputted to the one input terminal thereof which is outputted from the inverter 28 so as to output, as a result of its exclusive-or process, the H level signal. This means that the polarity switching signal Sp inputted to the other input terminal of the EX-OR circuit 29 has the L level (second logic level that is a reverse of the H level) because the output signal from the inverter 28 has the H level so that the comparator 27 outputs to the inverter 28 the L level signal which corresponds to the result such that the modulation voltage Vin is higher than the reference voltage Vref.

Then, the microcomputer 18 holds the state of the polarity switching signal Sp so as to sequentially change the switching signals Sc1 to Scm, thereby gradually sequentially switching on the MOS transistors Q2 to Qn in an order of Q2, Q3, . . . , Qn in Step S3. Depending on the sequentially switches of the MOS transistors the reference voltage Vref is gradually increased by a predetermined voltage of, for example, 0.5 mV.

When the wakeup signal Swk turns from the H level into the L level according to the increase of the reference voltage Vref, the microcomputer 18 writes on the memory 35 and the register 36, as first adjustment data, the values of switching signals Sc1 and Scm and the level of polarity switching signals Sp, such as the L level, at the time that the wakeup signal Swk first turns into the L level in Step S4.

(2) In cases where the wakeup signal Swk turns into the L level, that is, the EX-OR circuit 29 executes the exclusive-or process and outputs the L level signal, because the polarity switching signal Sp which is inputted to the other input terminal of the EX-OR circuit 29 has the L level, the output signal from the inverter 28 has the L level so that the comparator 27 outputs to the inverter 28 the H level signal which corresponds to the result such that the modulation voltage Vin is lower than the reference voltage Vref.

This state such that the modulation voltage Vin is lower than the reference voltage Vref occurs when the comparator 27 has a negative offset voltage Voffset, and the absolute value of the offset voltage Voffset exceeds the threshold value Vth. The negative offset voltage causes the output of the comparator 27 not to become the L level unless the voltage at the reverse input terminal 27n is higher than that at the non-reverse input terminal 27p by the offset voltage Voffset.

In this state, the microcomputer 18 makes the polarity switching signal Sp reverse so as to turn the signal Sp from the L level into the H level in Step S5 so that the polarity switching signal Sp having the H level makes the MOS transistors Q19 and Q20 turn on. The MOS transistors Q19 and Q20 having on-states, respectively, allow the reference voltage Vref which equals to 0 V to be inputted to the reverse input terminal 27n of the comparator 27, and also allow the modulation voltage Vin which corresponds to the threshold voltage Vth to be inputted to the non-reverse input terminal 27p.

That is, in cases where the wakeup signal Swk has the L level, the input voltage with respect to the reverse input terminal 27n is the reference voltage Vref in reverse, as compares with the modulation voltage Vin in cases where the wakeup signal Swk turns into the H level. Similarly, in cases where the wakeup signal Swk has the L level, the input voltage with respect to the non-reverse input terminal 27p is the modulation voltage Vin in reverse, as compares with the reference voltage Vref in cases where the wakeup signal Swk turns into the H level.

As a result, in cases where the wakeup signal Swk has the L level, the polarity of the offset voltage Voffset caused by the differences between the reference voltage Vref and the modulation voltage Vin is reversed, as compared with that of the offset voltage Voffset caused thereby in cases where the wakeup signal Swk has the H level.

After the above processes, the microcomputer 18 executes processes similar to the processes in cases where the wakeup signal Swk has the H level. That is, the microcomputer 18 sequentially changes the switching signals Sc1 to Scm so as to gradually sequentially switch on the MOS transistors Q2 to Qn in an order of Q2, Q3, . . . , Qn, thereby making the reference voltage Vref gradually increase by a predetermined voltage of, for example, 0.5 mV in Step S6.

When the wakeup signal Swk turns from the H level into the L level according to the increase of the reference voltage Vref, the microcomputer 18 writes on the memory 35 and the register 36, as second adjustment data, the values of switching signals Sc1 and Scm and the level of polarity switching signals Sp, such as the H level, at the time that the wakeup signal Swk first turns into the L level in Step S7.

As a result, it is possible to set the threshold voltage Vth corresponding to the reference voltage Vref which is adjusted by the above processes regardless of the magnitude and the polarity of the offset voltage Voffset of the comparator 27.

When adjusting the threshold voltage Vth is completed, the wakeup circuit 16 can make the wakeup signal Swk turn from the L level into the H level at the time that the received radio signal exceeds the threshold voltage Vth with no reference to the magnitude and the polarity of the offset voltage Voffset of the comparator 27.

In addition, after shipping the in-vehicle ECT unit, even if the battery 20 thereof is removed therefrom, the microcomputer 18, when the power-on state of the in-vehicle ECT unit is reset, can read out the first adjustment data including the values of switching signals Sc1 to Scm and the level of the polarity switching signals Sp, which correspond to the threshold voltage Vth, in cases where the wakeup signal Swk turns into the L level, and the second adjustment data including the values of switching signals Sc1 to Scm and the level of polarity switching signals Sp, which correspond to the threshold voltage Vth, in cases where the wakeup signal Swk turns into the H level from the memory 35 so as to write them on the register 36.

As a result, even if the battery 20 of the n-vehicle ECT unit is removed therefrom, it is possible to store the first and second adjustment data on the register 36 without deleting them due to the.

As described above, the level determining circuit installed in the in-vehicle ECT unit of the first embodiment is configured to have the switching circuit 26 provided at the input side of the comparator 27 of which the comparing circuit 23 is composed, and to have the EX-OR circuit 29 provided at the output side of the comparator 27, making it possible to execute, in accordance with the polarity switching signal Sp, the polarity switching processes at the input side of the comparator 27 and, in correspondence with the polarity switching processes, the logic switching processes at the output side of the comparator 27. Therefore, the operations of the comparing circuit 23 are kept unchanged regardless of the polarity switching signal Sp.

Reversing the polarity of the polarity switching signal Sp allows the polarities of the modulation voltage Vin and the reference voltage Vref inputted to the comparator 27 to be reversed, making it possible to reverse the polarity of the offset voltage Voffset caused by the differences between the reference voltage Vref and the modulation voltage Vin. Therefore, even if the in-vehicle ECT unit has only positive power source, and whose threshold voltage Vth with respect to the modulation voltage Vin is smaller than the offset voltage Voffset, it is possible to set any desired threshold voltage Vth regardless of the polarity of the offset voltage of the comparator 27, allowing the detection sensitivity of the wakeup circuit with respect to the modulation voltage Vin to be increased.

The switching circuit 26 and the EX-OR circuit 29 have compact circuit sizes, respectively, so that it is possible to simplify the circuit structure of the comparing circuit as compared with that of the conventional comparing circuit. The quantities of the consumption current in both of the switching circuit 26 and the EX-OR circuit 29 are strongly small, making it possible to keep the total consumption current in the whole in-vehicle ECT unit substantially similar to that in the conventional in-vehicle ECT unit.

Second Embodiment

A second embodiment of the present invention in which the present invention is applied to an in-vehicle ETC unit will be described hereinafter with reference to FIGS. 5 and 6. Incidentally, in FIGS. 5 and 6, to the elements which are substantially the same as those in FIGS. 2 and 3, the same reference symbols shown in FIGS. 2 and 3 are assigned so as to explain the second embodiment of the present invention on the focus of the different points of the second embodiment from the first embodiment.

Figure 6:
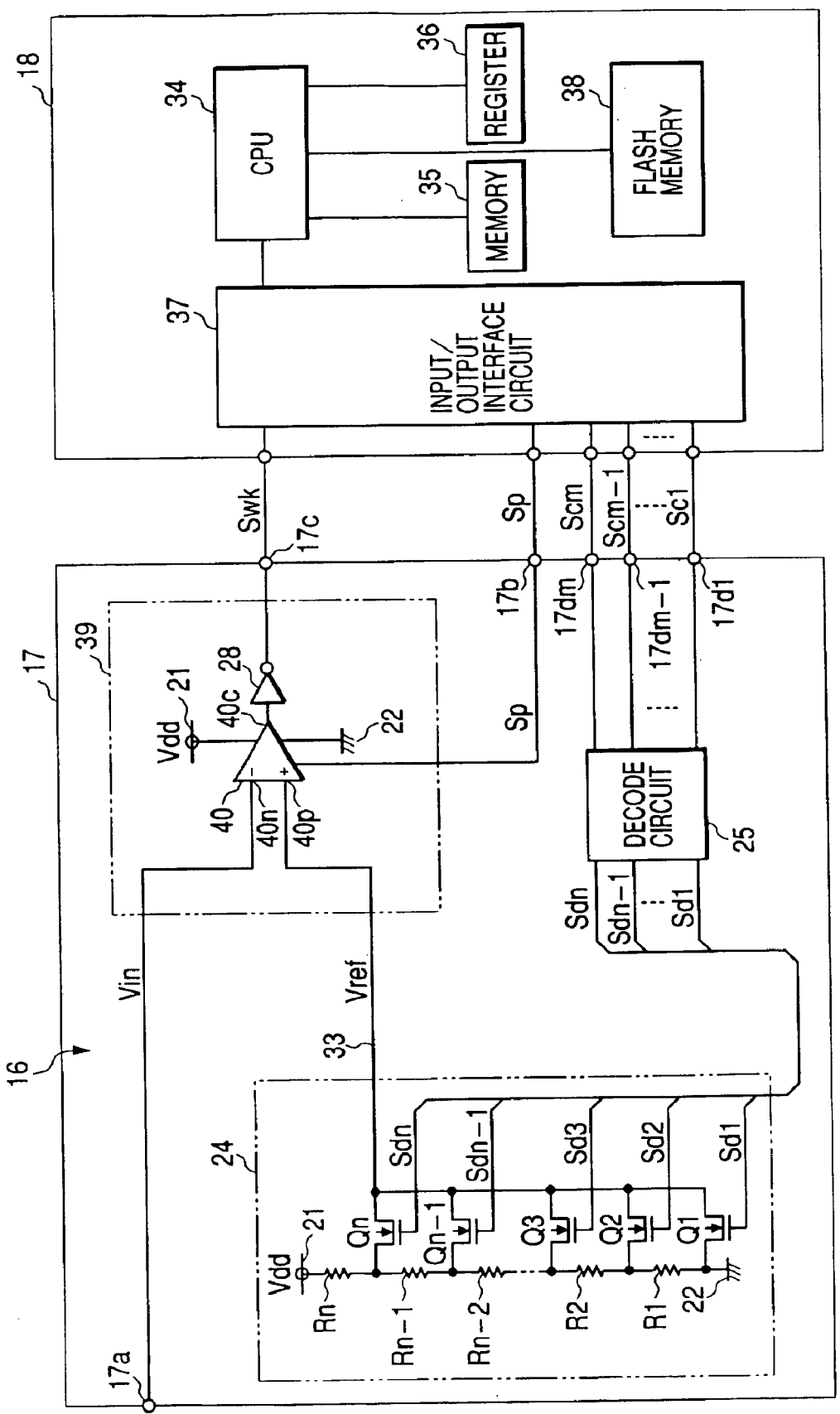
FIG. 6 is a view showing an electrical configuration of the comparator level detecting circuit in the in-vehicle ETC unit according to the second embodiment of the present invention.
Figure 7:
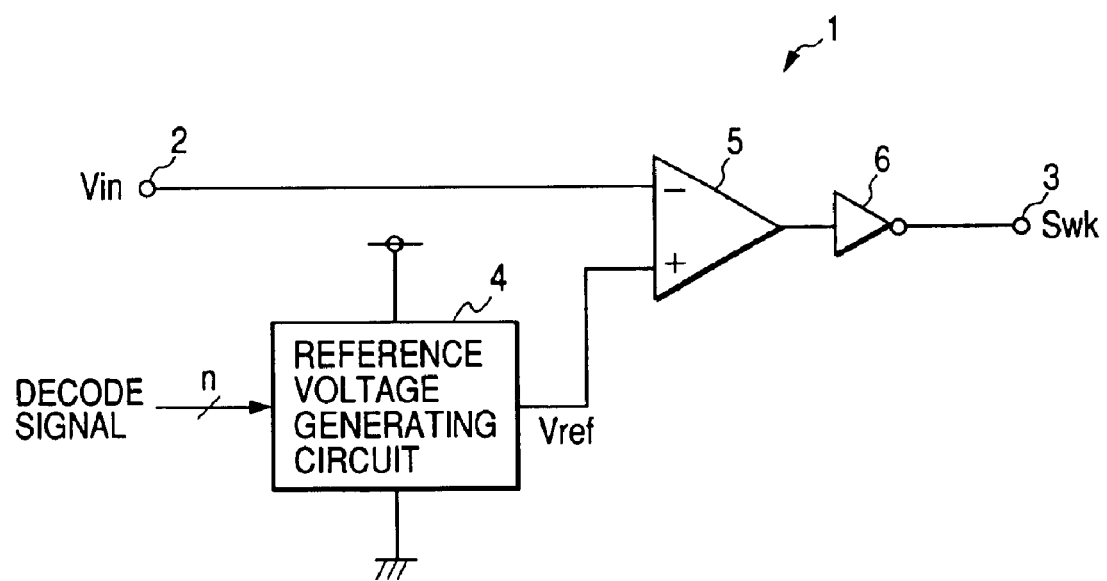
FIG. 7 is a view showing an electrical configuration of an wakeup circuit used for conventional in-vehicle ETC units.

In the level determining circuit shown in FIG. 6, the comparing circuit 39 comprises a comparator 40 and the inverter 28. The inverter 28 has an output terminal connected to the terminal 17c, and the polarity switching signal Sp is inputted to the comparator 40.

Figure 5:
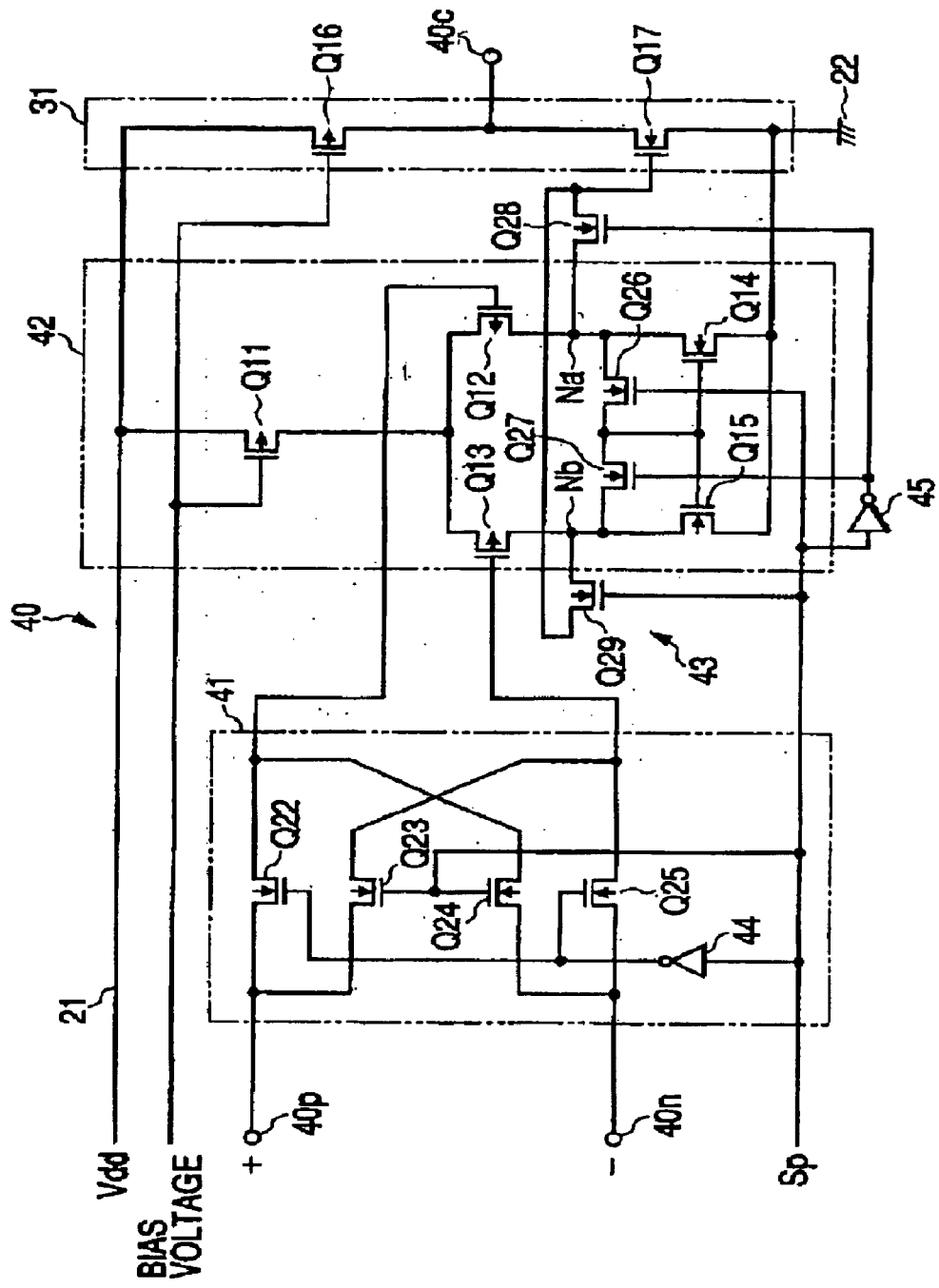
FIG. 5 is a view showing an electrical configuration of a comparator according to a second embodiment of the present invention.

FIG. 5 shows an electrical configuration of the comparator 40 according to the second embodiment of the present invention.

The comparator 40 comprises a first switching circuit 41 corresponding to an input signal switching circuit, a differential amplifier 42, a second switching circuit 43 corresponding to an output signal switching circuit 43 and the amplifier 31.

The first switching circuit 41 is arranged between input terminals 40p, 40n corresponding to first, second input terminals and the differential amplifier 42, and has the substantially same configuration of the switching circuit 26 shown in FIG. 2.

That is, the differential amplifier 42 comprises the MOS transistors Q11 to Q 15 located between the battery lines 21 and 22. The first switching circuit 41 is provided with MOS transistors Q 22 to Q25.

The MOS transistor Q22 is connected between the input terminal 40p and the gate of the MOS transistor Q12 corresponding to a first differential input transistor, and the MOS transistor Q23 is connected between the terminal 40p and the gate of the MOS transistor Q13 corresponding to a second differential input transistor. The MOS transistor Q24 is connected between the input terminal 40n and the gate of the MOS transistor Q12, and the MOS transistor Q25 is connected between the input terminal 40n and the gate of the MOS transistor Q13.

The microcomputer can supply the polarity switching signal Sp through the terminal 17b to the gates of the MOS transistors Q23 and Q24, and the polarity switching signal Sp is reversed by the inverter 44 so that the reversed polarity switching signal Sp' is configured to be supplied to the gates of the MOS transistors Q22 and Q25.

The MOS transistors Q22 to Q25 correspond to a first to fourth analog switching circuits according to the second embodiment of the present invention, respectively.

The differential amplifier 42 also includes, in addition to the structure of the differential amplifier 30 shown in FIG. 3, MOS transistors Q26 and Q27 correspond to a seventh and an eighth analog switching circuits. The MOS transistor Q26 is connected between the gate of the MOS transistor Q14 corresponding to a first load transistor and the drain thereof, and the MOS transistor Q27 is connected between the gate of the MOS transistor Q15 corresponding to a second load transistor and the drain thereof. These MOS transistors Q26 and Q27 are parts of the second switching circuit 43.

The second switching circuit 43, in addition to the transistors Q26 and Q27, comprises a MOS transistor Q28 corresponding to a fifth analog switching circuit and connected between an output node Na of the MOS transistor Q12 and the gate of the MOS transistor Q17. The second switching circuit 43 also comprises a MOS transistor Q29 corresponding to a sixth analog switching circuit and connected between an output node Nb of the MOS transistor Q13 and the gate of the MOS transistor Q17, and an inverter 45.

The polarity switching signal Sp is supplied to the gates of the MOS transistors Q26 and Q29, and the polarity switching signal Sp is reversed by the inverter 45 so that the reversed polarity switching signal Sp' is configured to be supplied to the gates of the MOS transistors Q27 and Q28.

Next, operations of the second embodiment will now be explained hereinafter. Especially, because the operations of the level determining circuit and the method of setting the threshold voltage of the level determining circuit are substantially the same as those of the first embodiment, the operations of the comparator 40 will be mainly explained hereinafter.

When the microcomputer 18 outputs the polarity switching signal Sp having the L level, because the inverter 44 reverses the polarity switching signal Sp so as to output the polarity switching signal Sp' having the H level, the H-level signals Sp' are supplied to the gates of the MOS transistors Q22 and Q25, respectively, the MOS transistors Q22 and Q25 turn on, respectively. The on-states of the MOS transistors Q22 and Q25 allow the reference voltage Vref inputted to the input terminal 40p and the modulation voltage Vin inputted to the input terminal 40n to be supplied to the gates of the MOS transistors Q12 and Q13 of the differential amplifier 42, respectively. In addition, because the inverter 45 reverses the polarity switching signal Sp so as to output the polarity switching signal Sp' having the H level, the H-level signals Sp' are supplied to the gates of the MOS transistors Q27 and Q28, respectively, so that the MOS transistors Q27 and Q28 turn on, respectively.

The on-states of the MOS transistors Q27 and Q28 cause the gate and the drain of the MOS transistor Q15 to be short-circuited, thereby providing the output signal from the MOS transistor Q12 to the gate of the transistor Q17.

On the other hand, when the microcomputer 18 outputs the polarity switching signal Sp having the H level, because the H-level signals Sp are supplied to the gates of the MOS transistors Q23 and Q24, respectively, the MOS transistors Q23 and Q24 turn on. The on-states of the MOS transistors Q23 and Q24 allow the reference voltage Vref inputted to the input terminal 40p and the modulation voltage Vin inputted to the input terminal 40n to be supplied to the gates of the MOS transistors Q13 and Q12 of the differential amplifier 42, respectively. In addition, because the H-level signals Sp are supplied to the gates of the MOS transistors Q26 nd Q29 of the switching circuit 43 respectively, so that the MOS transistors Q26 and Q29 turn on, respectively.

The on-states of the MOS transistors Q26 and Q29 cause the gate and the drain of the MOS transistor Q14 to be short-circuited, thereby providing the output signal from the MOS transistor Q13 to the gate of the transistor Q17.

That is, the switching circuits 41 and 43 execute to switch the polarity of the signal inputted to the comparator 40 in accordance with the polarity of the polarity switching signal Sp, thereby, in response to the switching process, executing the polarity of the signal outputted from the comparator 40.

Namely, in the differential amplifier 42, the output signal is taken out from the MOS transistor to which the reference voltage Vref is inputted through the input terminal 40p so that the operations of the comparator 40 are kept unchanged regardless of the switching state of the polarity switching signal Sp.

In addition, the signals inputted from the input terminals 40p and 40n are switched to be transmitted to the gates of MOS transistors Q12 and Q13 in accordance with the switch of the level of the polarity switching signal Sp, and the signals outputted from the MOS transistors Q12 and Q13 are switched to be transmitted to the referential amplifier 31 in accordance with the switch of the level of the polarity switching signal Sp, making it possible to reverse the polarity of the offset voltage Voffset caused by the differences between the reference voltage Vref of the input terminal 40p and the modulation voltage Vin of the input terminal 40n. The manufacturing differences between the characteristics of the MOS transistors Q12 and Q13, and those between the characteristics of the MOS transistors Q14 and Q15 cause the offset voltage Voffset of the differential amplifier 42. Because, however, in the comparator 40, the connection combinations between the MOS transistors Q12 and Q14, and between the MOS transistors Q13 and Q15 are held, the magnitude of the offset voltage is kept unchanged even if the level of the polarity switching signal Sp is switched.

Therefore, in cases of adjusting the threshold voltage Vth with respect to the modulation voltage Vin of the level determining circuit, setting the level of polarity switching signal Sp in accordance with the polarity of the offset voltage Voffset of the differential amplifier 42 on the basis of the threshold voltage adjusting method described in the first embodiment, allows the threshold voltage Vth to be set, threshold voltage Vth which is smaller than the offset voltage Voffset of the differential amplifier 42.

Moreover, employing the comparator 40 to the comparing circuit 39 of the in-vehicle ETC unit permits the consumption current to be furthermore reduced. That is, in the comparator 27, when the polarity switching signal Sp is set to have the H level, the output signal of the comparator 27 has the L level while the wakeup signal Swk has the L level, that is, the microcomputer 18 and so on have sleep-state. During the wakeup signal Swk has the L level, the MOS transistor is on-state so that current flows through the MOS transistors Q16 and Q17 between the battery lines 21 and 22. Because the in-vehicle ETC unit has considerable long sleep period, it is preferable to reduce the consumption current which is consumed during the sleep period.

On the contrary, in the comparator 40 according to the second embodiment, the output signal of the comparator 40 always has the H level while the wakeup signal Swk has the L level, that is, the microcomputer 18 and so on have sleep-state regardless of the level of the polarity switching signal Sp, making the MOS transistor Q17 only off-state during the sleep period, thereby cutting the current which allows to flow through the MOS transistors Q16 and Q17.

Another Modifications

Incidentally, the present invention is not limited to each embodiment shown in the descriptions and drawings so that the present invention can include another modifications and enlargements, some of which are shown hereinafter.

Each circuit, such as the level determining circuit which is configured to have the MOS transistors may be configured to another type of transistors such as bipolar transistors each of which has a base as its middle section (terminal) corresponding to the gate of the MOS transistor, a collector and an emitter as its sections (terminals) corresponding to the source and the drain thereof.

In the first embodiment, the input polarity switching circuit is not limited to the switching circuit 26. For example, the first and second input terminals may be connected to the terminals of the IC 17, and the switching relationship between the terminals of the IC 17 may be configured to be externally switched by, for example, at least one of switching elements, at least one of jumper wires or the like. The output logic switching circuit may be configured to, for example, processes of the microcomputer 18, in place of the EX-OR circuit 29.

The output logic switching circuit is not necessary to the present invention. That is, the microcomputer 18 may configured to, in place of the output logic switching circuit, receive the output signal from the comparator so as to judge the levels of the received signal.

The reference voltage generating circuit is not limited to the D/A converter 24, and may be configured to, for example, a variable resistor.

The threshold voltage setting circuit is not limited to the microcomputer 18. Another circuits which can output the predetermined polarity switching signal Sp to the comparing circuits 23 and 39, and output the switching signals Sc1 to Scm to the decode circuit 25 may be used as the threshold voltage setting circuit.

For example, as the threshold voltage setting circuit, a setting circuit with a switch, a jumper wire, a flip-flop circuit, a memory or a register without a CPU, or other similar circuits may be used.

The microcomputer 18 may not have the memory 35 so that the adjustment data may be written on the register 36 when the in-vehicle ETC unit is shipped. In this case, when the battery 20 of the in-vehicle ECT unit is removed, the adjustment data are disappeared.

It is possible for an operator to adjust the threshold voltage Vth with adjustment jigs or the like, in place of the microcomputer 18 which is capable of executing it in accordance with the adjustment program.

The level determining circuit, the threshold voltage adjusting method thereof, the comparing circuits 23, 39 and the comparator 40 according to the present invention are not limited to be applied to the he wakeup circuit 16 of the in-vehicle ETC unit, and may be widely applied to circuits each having a function for comparing an input signal as a threshold level.

While there has been described what is at present considered to be the preferred embodiments and modifications of the present invention, it will be understood that various modifications which are not described yet may be made therein, and it is intended to cover in the appended claims all such modifications as fall within the true spirit and scope of the invention.

The entire contents of Japanese Patent Application 2001 332672 filed on Oct. 30, 2001 is incorporated herein.

What is claimed is:

1. A comparing circuit comprising:
an input signal switching circuit having a first input terminal, a second input terminal, a first output terminal and a second output terminal, the input signal switching circuit configured to receive a first input signal inputted to the first input terminal and a second input signal inputted to the second input terminal, the input signal switching circuit further configured to switchably output the first input signal to one of the first and second output terminals and the second input signal to the other thereof in accordance with a polarity switching signal;
a comparator having a reverse input terminal and a non-reverse input terminal the comparator configured to receive through the reverse input terminal a first signal outputted from the first output terminal, and receive through the non-reverse input terminal a second signal outputted from the second output terminal, the comparator comparing the first signal and the second signal so as to output a result signal representing a result of the comparison; and
an output logic switching circuit configured to receive the result signal so as to switchably execute, in accordance with the polarity switching signal, one of a reversing process to reverse the result signal to output the reversed result signal and a non-reversing process to output the result signal.

2. A comparing circuit according to claim 1, wherein the input signal switching circuit comprises:
a first analog switching circuit connected between the first input terminal and the first output terminal;
a second analog switching circuit connected between the first input terminal and the second output terminal;
a third analog switching circuit connected between the second input terminal and the first output terminal; and
a fourth analog switching circuit connected between the second input terminal and the second output terminal;
wherein the first and fourth analog switching circuits are configured to be turned on by the polarity switching signal at a first logic level, and the second and third analog switching circuits are configured to be turned on by the polarity switching signal at a second logic level reverse of the first logic level.

3. A comparing circuit according to claim 2, wherein the output logic switching circuit is configured to execute an exclusive-or process as one of the reversing process on the basis of the polarity switching signal and the result signal so as to output a logic signal as the result signal generated by the exclusive-or process, the polarity switching signal representing one of the first logic level and the second logic level, and the result signal representing one of the first logic level and the second logic level, the second logic level being a reverse of the first logic level.

4. A level determining circuit for determining a level of a first input signal, the level determining circuit comprising:
a comparing circuit including:
an input signal switching circuit having a first input terminal, a second input terminal, a first output terminal and a second output terminal, the input signal switching circuit configured to receive the first input signal inputted to the first input terminal and a second input signal inputted to the second input terminal, the input signal switching circuit further configured to switchably output the first input signal to one of the first and second output terminals and the second input signal to an other thereof in accordance with a polarity switching signal; and
a comparator having a reverse input terminal and a non-reverse input terminal and configured to receive at the reverse input terminal, a first signal outputted from the first output terminal, and receive at the non-reverse input terminal, a second signal outputted from the second output terminal, the comparator comparing the first input signal and the second input signal so as to output a result signal representing a result of the comparison;
a reference voltage generating circuit capable of generating a plurality of reference voltages and configured to output one of the plurality of reference voltages based on a reference voltage setting signal; and
a threshold voltage setting circuit configured to output the polarity switching signal to the comparing circuit and to output the reference voltage setting signal to the reference voltage generating circuit;
wherein the first input signal having a voltage is inputted to the first input terminal of the comparing circuit, and one of the plurality of reference voltages is inputted to the second input terminal thereof as the second input signal, and wherein the comparator compares the voltage of the first input signal and the one of the plurality of reference voltages so as to output the result signal representing the result of the comparison.

5. A level determining circuit for determining a level of a first input signal, the level determining circuit comprising:
a comparing circuit including:
an input signal switching circuit having a first input terminal, second input terminal, a first output terminal and a second output terminal, the input signal switching circuit configured to:
receive the first input signal inputted to the first input terminal and a second input signal inputted to the second input terminal, and
switchably output the first input signal to the first output terminal and the second input signal to the second output terminal when a level of the polarity switching signal is a first logical level, and output the first input signal to the second output terminal and the second input signal to the first output terminal when the level of the polarity switching signal is a second logic level different from the first logic level; and a comparator having a reverse input terminal and a non-reverse input terminal, the comparator configured to:
receive through the reverse input terminal a first signal outputted from the first output terminal, and receive through the non-reverse input terminal a second signal outputted from the second output terminal,
compare the first signal and the second signal, and output first and second result signals representing results of the comparison;

a reference voltage generating circuit capable of generating a plurality of reference voltages and configured to output one of the plurality of reference voltages based on a reference voltage setting signal;

a threshold voltage setting circuit configured to set the level of the polarity switching signal to the first logic level and to output the reference voltage setting signal to the reference voltage generating circuit, wherein the first input signal having a voltage is inputted to the first input terminal of the input signal switching circuit of the comparing circuit;

means for setting the reference voltage setting signal such that a lowest one of the plurality of reference voltages is outputted from the reference voltage generating circuit, thereby inputting to the second input terminal of input signal switching circuit of the comparing circuit the lowest one of the reference voltages outputted from the reference voltage generating circuit as the second input signal, the comparator receiving through the reverse input terminal the first input signal as the first signal and receiving through the non-reverse input terminal the outputted reference voltage from the input signal switching circuit as the second signal;

means, operative when the comparing circuit outputs the first result signal representing that the voltage of the first input signal is higher than a reference voltage at which the level of the polarity switching signal is at the first logic level, for sequentially changing a value of the reference voltage setting signal to sequentially increase the reference voltage inputted to the second input terminal of the signal switching circuit while the comparing circuit outputs the second result signal representing that the voltage of the first input signal is not higher than the reference voltage;

means for storing thereon the first logic level of the polarity switching signal and the value of reference voltage setting signal at the time when the change operation of the value of the reference voltage setting signal by the sequentially changing means is stopped so that the first logic level and the value of the reference voltage setting signal are associated with each other;

means, operative when the comparing circuit outputs the second result signal representing that the voltage of the first input signal is not higher than the reference voltage at which the level of the polarity switching signal is at the first logic level, for reversing the first logic level of the polarity switching signal into the second logic level thereof so that the output of the comparing circuit is changed to the first result signal representing that the voltage of the first input signal is higher than the reference voltage, and for changing sequentially the value of the reference voltage setting signal so as to sequentially increase the reference voltage inputted to the second input terminal of the signal switching circuit while the comparing circuit outputs the first result signal representing that the voltage of the first input signal is higher that the reference voltage, thereby stopping the change of the value of the reference voltage setting signal when the comparing circuit outputs the second result signal representing that the voltage of the first input signal is not higher than the reference voltage; and means for storing thereon the second logic level of the polarity switching signal and the value of reference voltage setting signal at the time when the change of the value of the reference voltage setting signal by the reversing means is stopped so that the second logic level and the value of reference voltage setting signal are associated with each other.

6. A method of setting a threshold voltage in a threshold voltage level determining circuit, the threshold voltage level determining circuit comprising:

a comparing circuit including:
an input signal switching circuit having a first input terminal, a second input terminal, a first output terminal and a second output terminal, the input signal switching circuit configured to receive a first input signal inputted to the first input terminal and a second input signal inputted to the second input terminal, the input signal switching circuit being configured to switchably output the first input signal to the first output terminal and the second input signal to the second output terminal when a level of the polarity switching signal is a first logic level, and output the first input signal to the second output terminal and the second input signal to the first output terminal when the level of the polarity switching signal is a second logic level different from the first logic level; and a comparator having a reverse input terminal and a non-reverse input terminal and configured to receive through the reverse input terminal a first signal outputted from the first output terminal and receive through the non-reverse input terminal a second signal outputted from the second output terminal, the comparator comparing the first signal and the second signal so as to output first and second result signals representing results of the comparison;

a reference voltage generating circuit capable of generating a plurality of reference voltages and configured to output one of the plurality of reference voltages based on a reference voltage setting signal; and a threshold voltage setting circuit configured to set the level of the polarity switching signal to the first logic level and to output the reference voltage setting signal to the reference voltage generating circuit, wherein the first input signal having a voltage is inputted to the first input terminal of the input signal switching circuit of the comparing circuit the method comprising:

setting the reference voltage setting signal such that a lowest one of the plurality of reference voltages is outputted from the reference voltage generating circuit, thereby inputting to the second input terminal of the input signal switching circuit of the comparing circuit the lowest one of the reference voltages outputted from the reference voltage generating circuit as the second input signal, the comparator receiving through the reverse input terminal the first input signal as the first signal and receiving through the non-reverse input terminal the outputted reference voltage from the input signal switching circuit as the second signal;

sequentially changing, when the comparing circuit outputs the first result signal representing that the voltage of the first input signal is higher that the reference voltage at which the level of the polarity switching signal is the first logic level, a value of the reference voltage setting signal to sequentially increase the reference voltage inputted to the second input terminal of the signal switching circuit while the comparing circuit outputs the first result signal representing that the voltage of the first input signal is higher than the reference voltage, and for stopping the change of the value of the reference voltage setting signal when the comparing circuit outputs the second result signal representing that the voltage of the first input signal is not higher than the reference voltage;

storing the first logic level of the polarity switching signal and the value of reference voltage setting signal at the time when the sequential changing operation of the value of the reference voltage setting signal is stopped so that the first logic level and the value of the reference voltage setting signal are associated with each other;

reversing, when the comparing circuit outputs the second result signal representing that the voltage of the first input signal is not higher than the reference voltage at which the level of the polarity switching signal is the first logic level, the first logic level of the polarity switching signal into the second logic level thereof so that the output of the comparing circuit is changed to the first result signal representing that the voltage of the first input signal is higher than the reference voltage, and sequentially changing the value of the reference voltage setting signal so as to sequentially increase the reference voltage inputted to the second input terminal of the signal switching circuit while the comparing circuit outputs the first result signal representing that the voltage of the first input signal is higher than the reference voltage, thereby stopping the change of the value of the reference voltage setting signal when the comparing circuit outputs the second result signal representing that the voltage of the first input signal is not higher than the reference voltage; and storing the second logic level of the polarity switching signal and the value of reference voltage setting signal at the time when the change operation of the value of the reference voltage setting signal by the reversing step is stopped so that the second logic level and the value of the reference voltage setting signal are associated with each other.

* * * * *